(12) United States Patent
Kim et al.

(10) Patent No.: US 9,166,189 B2
(45) Date of Patent: Oct. 20, 2015

(54) FABRICATION METHOD FOR ORGANIC LIGHT EMITTING DEVICE AND ORGANIC LIGHT EMITTING DEVICE FABRICATED BY THE SAME METHOD

(71) Applicant: LG Chem, Ltd., Seoul (KR)

(72) Inventors: Jung-Bum Kim, Daejeon (KR); Jung-Hyoung Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 14/601,866

(22) Filed: Jan. 21, 2015

(65) Prior Publication Data
US 2015/0162561 A1    Jun. 11, 2015

Related U.S. Application Data

(62) Division of application No. 12/225,100, filed as application No. PCT/KR2007/001284 on Mar. 15, 2007, now Pat. No. 8,969,126.

(60) Provisional application No. 60/782,287, filed on Mar. 15, 2006.

(51) Int. Cl.
*H01L 51/52* (2006.01)

(52) U.S. Cl.
CPC ..... *H01L 51/5234* (2013.01); *H01L 2251/5315* (2013.01); *H01L 2251/558* (2013.01)

(58) Field of Classification Search
CPC ...................................................... H01L 33/36
USPC ........................................................ 438/99
See application file for complete search history.

(56) References Cited

U.S. PATENT DOCUMENTS

| | | | |
|---|---|---|---|
| 5,776,622 A | 7/1998 | Hung et al. | |
| 6,016,033 A | 1/2000 | Jones et al. | |
| 6,215,245 B1 | 4/2001 | Mori | |
| 6,255,774 B1 | 7/2001 | Pichler | |
| 6,355,558 B1 | 3/2002 | Dixit et al. | |
| 6,762,436 B1 * | 7/2004 | Huang et al. | 257/82 |
| 6,946,319 B2 | 9/2005 | Stegamat et al. | |
| 2003/0022438 A1 | 1/2003 | Callaway | |
| 2003/0193066 A1 | 10/2003 | Ito et al. | |
| 2005/0082514 A1 | 4/2005 | Yoshimoto et al. | |
| 2005/0147847 A1 | 7/2005 | Nakamura | |
| 2007/0170843 A1 | 7/2007 | Kawamura et al. | |

FOREIGN PATENT DOCUMENTS

| | | |
|---|---|---|
| JP | 5-174975 | 7/1993 |
| JP | 08-124678 | 5/1996 |
| JP | 09-232079 | 9/1997 |

(Continued)

OTHER PUBLICATIONS

Chen Chieh-Wei et al.: "An effective cathode structure for inverted top-emitting organic light-emitting devices", Applied Physics Letters, AIP, American Institute of Physics, Melville, NY, US, vol. 85, No. 13, Jan. 1, 2004, pp. 2469-2471, XP012062672.

*Primary Examiner* — Yu-Hsi D Sun
(74) *Attorney, Agent, or Firm* — Dentons US LLP

(57) ABSTRACT

An organic light emitting device includes a cathode made of metal, at least one organic material layer including a light emitting layer, and an anode in the sequentially layered form. The organic light emitting device also includes a thin metal film that is interposed between the cathode and the organic material layer.

4 Claims, 1 Drawing Sheet

(56) References Cited

FOREIGN PATENT DOCUMENTS

| JP | 2002367780 | 12/2002 |
| JP | 2004-071460 | 3/2004 |
| JP | 2004-127551 | 4/2004 |
| JP | 2004-200141 | 7/2004 |
| JP | 2005-259550 | 9/2005 |
| KR | 10 20020028035 | 4/2002 |
| KR | 10 20030069707 | 8/2003 |

* cited by examiner

FABRICATION METHOD FOR ORGANIC LIGHT EMITTING DEVICE AND ORGANIC LIGHT EMITTING DEVICE FABRICATED BY THE SAME METHOD

This application is a divisional application of Ser. No. 12/225,100, filed Sep. 12, 2008, which is 371 national stage entry of International Application No. PCT/KR2007/001284, filed on Mar. 15, 2007 that claims priority to U.S. Provisional Application No. 60/782,287, filed on Mar. 15, 2006, all of which are hereby incorporated by reference in their entirety.

This application claims priority from U.S. Provisional Patent Application No. 60/782,287 filed on Mar. 15, 2006 in the USPTO, the disclosure of which is incorporated herein by reference in its entirety.

TECHNICAL FIELD

The present invention relates to a method of fabricating an organic light emitting device and an organic light emitting device fabricated using the same. More particularly, the present invention pertains to a method of fabricating an organic light emitting device that has excellent electron injection efficiency and device properties even though a native oxide layer is provided on a surface of a cathode made of metal during the fabrication of the organic light emitting device, and an organic light emitting device fabricated using the same.

BACKGROUND ART

Generally, organic light emission means that electric energy is converted into light energy by using an organic substance. An organic light emitting device (OLED) using the organic light emission typically includes an anode, a cathode, and an organic material layer that is interposed between the anode and the cathode. The organic material layer is to have a multilayered structure made of different substances in order to improve efficiency and stability of the organic light emitting device. For example, the organic material layer may be formed of a hole injection layer, a hole transport layer, a light emitting layer, an electron transport layer, an electron injection layer, etc. If voltage is applied between two electrodes in the organic light emitting device having the above-mentioned structure, a hole is injected into the organic material layer at an anode and an electron is injected into the organic material layer at a cathode. When the hole meets the electron, an exciton is generated, and light is generated when the exciton is converted into a bottom state. It is known that the organic light emitting device has properties such as self-light emission, high luminance, high efficiency, a low driving voltage, a wide viewing angle, high contrast, and a high-speed response.

Various types of organic light emitting devices are known in the related art and they may be used for different applications. Examples of an organic light emitting device include a top light emitting OLED, a bottom light emitting OLED, and a dual-sided light emitting OLED.

If bottom light emitting OLEDs are used in active matrix displays, thin film transistors (TFT) are provided in front of the source of light emission, thereby reducing the ratio of the effective display area (aperture ratio). This problem is significant in the case when sophisticated displays having many TFTs are manufactured. With respect to a bottom light emitting OLED having an aperture ratio of less than 40%, an estimated aperture ratio of a WXGA type display that includes a TFT for 14" grade is less than 20%. Such small aperture ratio negatively affects the driving power consumption and lifetime of the OLED.

The above-mentioned problem can be prevented by using a top light emitting OLED. In a top light emitting OLED, an electrode that is not in contact with a lower substrate, that is, an upper electrode, is substantially transparent in a visible ray region. A transparent electrode that is used to form the upper electrode of the top light emitting OLED is formed of a conductive oxide, such as IZO (indium zinc oxide) or ITO (indium tin oxide), or a thin film made of metal, such as MgAg, Al, Ag, Ca, and CaAg. However, an electrode that is in contact with the substrate is typically made of metal. Similar to the top light emitting OLED, the dual-sided light emitting OLED includes a transparent upper electrode.

FIG. 1 illustrates a lower portion of an inverted organic light emitting device. As shown in FIG. 1, when forming a top light emitting OLED, after a metal cathode is deposited on a substrate, a undesirable native oxide layer is formed on a surface of a cathode. In detail, when the metal cathode is patterned by using photolithography and etching processes during the fabrication of an organic light emitting device, the metal cathode is exposed to moisture and oxygen, causing a native oxide layer to be formed on the metal electrode.

The native oxide layer reduces properties of the cathode, that is, electron injection properties, thus reducing efficiency and luminance of the organic light emitting device.

One process to prevent the native oxide layer from being formed on the cathode is to form an organic material layer on the deposited cathode in situ. During the process, since the cathode is not exposed to air, the oxide layer is not formed on the surface of the cathode. However, it is costly and difficult to perform both a process of forming a TFT substrate including a cathode and a process of forming an organic material layer and other layers in a vacuum in situ.

In addition, a raw material supplier sometimes supplies a TFT substrate, on a surface of which a cathode is layered, while the substrate is exposed to air before an organic substance is deposited. In this case, there is a problem in that the native oxide layer is formed on the cathode. Therefore, in the related art, a TFT substrate that includes an anode made of a substance such as ITO is frequently used. However, in this case, since a TFT process line of a conventional LCD process of fabricating an n-type TFT where electrons are injected cannot be used, and the TFT substrate including an oxide electrode such as ITO is used to manufacture a bottom light emitting OLED, it is not suitable to manufacture a top light emitting OLED.

Therefore, there is a need to develop an organic light emitting device having improved electron injection properties, even though the native oxide layer is provided on the metal cathode, and a method of fabricating the same.

DISCLOSURE OF INVENTION

Technical Problem

Therefore, it is an object of the present invention to provide an organic light emitting device having excellent electron injection efficiency and device properties even though a native oxide layer is provided on a metal cathode during the fabrication of the organic light emitting device, and a method of fabricating the same.

Technical Solution

In order to accomplish the above object, the present invention provides a method of fabricating an organic light emitting device, comprising the steps of sequentially forming a cathode made of metal, at least one organic material layer including a light emitting layer, and an anode on a substrate, wherein the method comprises the step of forming a thin metal film on a native oxide layer that is spontaneously formed on the cathode before forming of the organic material layer.

Furthermore, the present invention provides an organic light emitting device comprising a cathode made of metal, at least one organic material layer including a light emitting layer and an anode in the sequentially layered form, wherein the organic light emitting device comprises a thin metal film that is interposed between the cathode and the organic material layer.

Advantageous Effects

According to the present invention, an additional thin metal film is provided on a native oxide layer that is spontaneously on a cathode made of metal during the fabrication of an organic light emitting device to improve electron injection properties of a cathode even though the native oxide layer is provided on the cathode made of metal. Accordingly, a device driving voltage is reduced and device properties are improved.

BEST MODE FOR CARRYING OUT THE INVENTION

Figure 1:
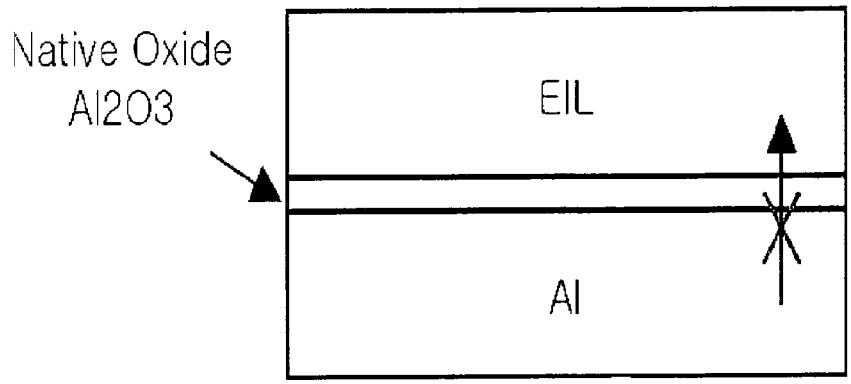
FIG. 1 illustrates a sectional view of a lower structure of a typical inverted organic light emitting device that includes an oxide layer on a metal cathode.

A detailed description will be given of the present invention hereinafter.

A method of fabricating an organic light emitting device according to the present invention comprises the steps of sequentially forming a cathode made of metal, at least one organic material layer including a light emitting layer, and an anode on a substrate, and additionally comprises the step of forming a thin metal film on a native oxide layer that is spontaneously formed on the cathode before forming of the organic material layer. Furthermore, an organic light emitting device according to the present invention comprises a cathode made of metal, at least one organic material layer including a light emitting layer and an anode in the sequentially layered form, and additionally comprises a thin metal film that is interposed between the cathode and the organic material layer.

When the organic light emitting device is fabricated, the cathode is exposed to the air during a patterning process or after a patterning process, so that a native oxide layer, for example, an aluminum oxide ($Al_2O_3$) layer, is formed on an upper side of the cathode. The native oxide layer reduces electron injection properties of the cathode. Therefore, it is difficult to operate the organic light emitting device.

However, in the present invention, before the organic material layer is formed, the thin metal film is provided on the native oxide layer on the cathode to provide an organic light emitting device having excellent electron injection properties and device properties even though the native oxide layer is provided. In detail, the thin metal film acts as if it is doped into the native oxide layer to change an interface junction characteristic between the native oxide layer and the organic material layer provided on the native oxide layer.

For example, in the case when the cathode that is disposed on the substrate and made of metal is exposed to the air to form the native oxide layer thereon and a LiF layer is formed on the native oxide layer as the electron injection layer, the native oxide layer contacts with the LiF layer at the interface between the cathode and the LiF layer, thus, the electron injection properties are reduced. However, if the native oxide layer is subjected to thin metal film treatment, interfacial properties between the electron injection layer and the cathode are changed. Therefore, injection of electrons through the native oxide layer and the electron injection layer into the organic material layers is improved.

According to the above-mentioned mechanism, in the present invention, even though a process of forming a TFT substrate including the metal cathode and a process of forming the organic material layers and other layers are separately performed and thus the native oxide layer is formed on the metal cathode, a negative effect to the electron injection properties of the device may be prevented. Thereby, it is possible to provide an organic light emitting device having excellent device properties through a simpler process at lower cost in comparison with a conventional process. In addition, a TFT process line of a conventional LCD process of fabricating an n-type TFT where electrons are injected may be used as a process of forming the TFT substrate including the metal cathode.

The thickness of the thin metal film is preferably less than 7 nm, and more preferably 1 to 5 nm. The thickness of the thin metal film is significantly affected by roughness of the surface of the metal cathode on which the oxide layer is formed. Generally, in the case when the thickness is less than 1 nm, the driving voltage may become unstable over time. In the case when the thickness is 7 nm or more, since the thin metal film has a conductivity in a surface direction, it is difficult to use a process that form the thin metal film on the entire surface of the substrate.

In the case when the thin metal film is formed to have a thickness of less than 7 nm, preferably 5 nm or less, the thin metal film may change the interfacial properties in respect to the electron injection properties in upward and downward directions as described above, but does not have the conductivity in left and right surface directions. Therefore, since it is not necessary to deposit the thin metal film on only pixels separated from each other, the thin metal film may be provided on the entire surface of the substrate on which the cathode is formed without using a photomask. Accordingly, a very simple process is performed at low cost.

Any metal may be used as a material of the thin metal film as long as the metal has properties that are similar to those of a material of the cathode made of metal, and it is more preferable to use the same material as the cathode. For example, metal having a work function of 5 eV or less, and preferably 4.5 eV or less, is used. In detail, metal such as Al, Ag, Ca, Li, Cs, and Mg, or an alloy thereof may be used. More preferably, Al or Ag is used, and, most preferably, Al is used.

It is preferable that the formation of the thin metal film and the subsequent process, that is, the formation of the organic material layers, be performed in situ. The formation of the thin metal film is not limited as long as the formation of the thin metal film and the organic material layers is performed in situ. For example, the thin metal film may be formed by using a process such as heat deposition, sputtering, electronic beam deposition, or ionic beam deposition. For example, the thin metal film is formed by using vacuum heat deposition at 600 to 900° C. and $10^{-7}$ torr for 10 to 20 sec, and the organic material layers are formed in situ in the chamber in which the thin metal film is formed.

In an active matrix organic light emitting device structure, pixels may be laterally separated by an insulating structure. In the present invention, as described above, the thin metal film provided on the cathode affect the electron injection properties in a vertical direction, but does not have the conductivity in a surface direction. Accordingly, in the case when the thin metal film is formed on the entire surface having the insulating structure, the thin metal film does not affect lateral leakage of current.

In the organic light emitting device according to the present invention, the cathode, the at least one organic material layer including the light emitting layer, and the anode may be formed using a known material by means of a known process, except that the thin metal film is interposed between the cathode and the organic material layer.

The organic light emitting device according to the present invention may be applied to a top light emitting OLED, a bottom light emitting OLED, and a dual-sided light emitting OLED. Particularly, the organic light emitting device according to the present invention is useful to a top light emitting OLED or a dual-sided light emitting OLED.

The cathode may be formed of one or more metal layers. Examples of metal that is capable of being used to form the cathode include, but are not limited to aluminum, molybdenum, chromium, magnesium, calcium, sodium, potassium, titanium, indium, yttrium, lithium, gadolinium, silver, tin, lead, or an alloy thereof. Among the above-mentioned metals, it is more preferable to use an aluminum electrode having relatively higher reflection (>50%). The metal materials may be deposited on the substrate by using a deposition process such as heat deposition or sputtering. Additionally, the metal may be patterned by using a known process in the related art such as a photolithography and etching process to form a cathode electrode.

The anode may be made of a transparent conductive substance. Like the cathode, the anode may be formed of one or more layers. In the case when the organic light emitting device according to the present invention is a top light emitting OLED or a dual-sided light emitting OLED, since it is required that light is capable of being transmitted through the anode, a transparent material having low reflection is used as a material of the anode. For example, indium tin oxide (ITO) or indium zinc oxide (IZO) may be used. In addition, the anode may be a thin film that is made of metal such as MgAg, Al, Ag, Ca, or CaAg.

The organic material layer may have a single layer structure or a multilayered structure including two or more layers according to the type of organic substance. That is, in the case when the organic material layer is made of an organic substance having light emitting properties as well as hole and electron transport properties, the organic material layer may be formed to have a single layer structure. Meanwhile, two or more organic material layers that are made of an organic substance having one or more properties of hole injection, hole transport, light emission, electron transport, and electron injection properties may be layered to form an organic material layer having a multilayered structure. Preferably, the organic material layer may include an electron injection layer or a hole injection layer in addition to a light emitting layer, and any one of the electron injection layer and the hole injection layer may be formed to come into contact with the thin metal film.

The organic material layer may be made of an organic material containing imidazole, oxazole, and thiazole. The organic material layer may be formed by codepositing an organic material with metal having a low work function, for example, Li, Cs, Na, Mg, Sc, Ca, K, Ce, and Eu.

In the present invention, in the case when the electron injection layer comes into contact with the thin metal film, the electron injection layer may preferably be made of alkali metal fluoride, and more preferably lithium fluoride (LiF) having a better electron injection ability.

The organic material layer may be produced by using a process other than the deposition process, for example, spin coating, dip coating, doctor blading, screen printing, inkjet printing, or heat transferring.

The organic material layer according to the present invention may include an additional layer such as a buffer layer that is known in the related art in order to improve efficiency and a physical structure of the organic light emitting device.

Figure 2:
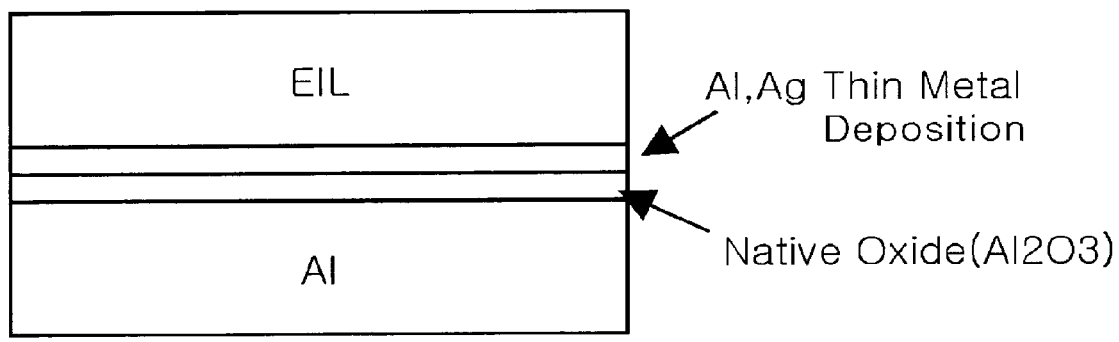
FIG. 2 illustrates an organic light emitting device according to an embodiment of the present invention.

FIG. 2 illustrates a lower structure of an inverted device among the organic light emitting devices according to the present invention. With reference to FIG. 2, a lower electrode is made of Al, and a native oxide layer is made of $Al_2O_3$ thereon, which reduces electron injection efficiency. In the present invention, a thin metal film that is made of Al or Ag and has a thickness of 5 nm or less may be provided on the native oxide layer in order to improve electron injection efficiency according to the above-mentioned mechanism.

MODE FOR THE INVENTION

A better understanding of an organic light emitting device and a method of fabricating the same according to the present invention may be obtained in light of the following examples which are set forth to illustrate, but are not to be construed to limit the present invention.

EXAMPLE 1

Aluminum was deposited on a glass substrate by using a sputtering process to form an electron injection electrode and then subjected to photolithography and etching, and the resulting substrate was left in the air for about 16 hours to form an aluminum oxide film as a native oxide layer. Subsequently, the substrate was maintained in a vacuum of $10^{-7}$ torr, and an aluminum thin film was heat-deposited on the aluminum oxide film to have a thickness of 1 nm. Lithium fluoride having a thickness of 1.5 nm, an electron transport layer (ETL), a light emitting layer (EML), a hole transport layer (HTL), and a hole injection layer (HIL) were sequentially layered thereon. The electron transport layer (ETL) was formed by using the following electron transport material to have a thickness of 20 nm, the light emitting layer (EML) was formed by using Alq3 (tri-8-hydroxyquinolinato aluminum) as a host and C545T (10-(2-Benzothiazolyl)-2,3,6,7-tetrahydro-1,1,7,7,-tetramethyl 1-1H,5H,11H-[1]benzopyrano [6,7,8-ij]quinolizin-11-one) as a dopant to have a thickness of 30 nm, and the hole transport layer (HTL) and the hole injection layer (HIL) were formed by using NPB (4,4'-bis[N-(1-naphtyl)-N-phenylamino]biphenyl) and hexanitril(hexaaza)triphenylene (HAT) to have a thickness of 40 nm and 70 nm, respectively. Then, IZO (Indium Zinc Oxide) as the hole injection electrode was deposited on the organic material layer by using the sputtering process to produce an organic light emitting device.

[Electron Transport Substance]

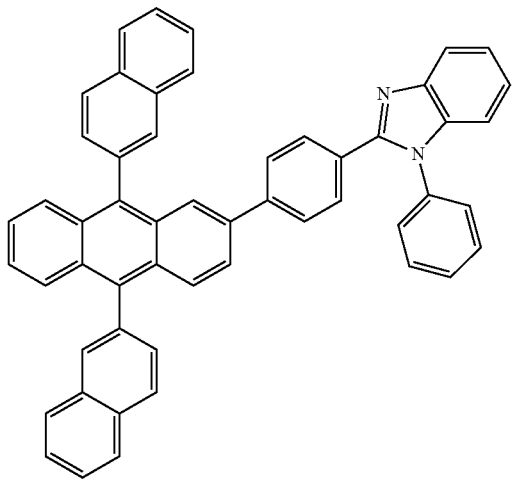 [SMILES: c1ccc(-n2c(-c3ccc(-c4ccc5c(-c6ccc7ccccc7c6)c6ccccc6c(-c6ccc7ccccc7c6)c5c4)cc3)nc3ccccc32)cc1]

EXAMPLE 2

An organic light emitting device was fabricated by using the same procedure as Example 1, except that the aluminum thin film was formed on the electron injection electrode to have a thickness of 3 nm, not 1 nm.

EXAMPLE 3

An organic light emitting device was fabricated by using the same procedure as Example 1, except that the aluminum thin film was formed on the electron injection electrode to have a thickness of 5 nm, not 1 nm.

COMPARATIVE EXAMPLE 1

An organic light emitting device was fabricated by using the same procedure as Example 1, except that the aluminum thin film was not formed on the aluminum electrode.

COMPARATIVE EXAMPLE 2

An organic light emitting device was fabricated by using the same procedure as Example 1, except that the aluminum thin film was formed on the electron injection electrode to have a thickness of 7 nm, not 1 nm.

1. Current-Voltage Properties

Figure 3:
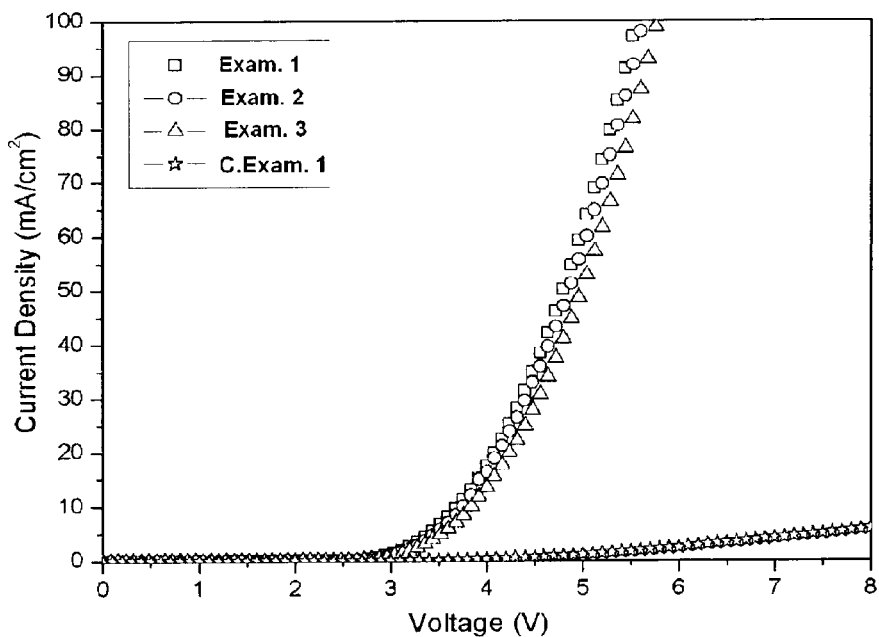
FIG. 3 is a graph illustrating a current density measured in devices fabricated in Examples 1 to 3 and Comparative example 1.

In respect to the devices that were fabricated in Examples 1 to 3 and Comparative example 1, a voltage in the range of 0 to 8 V was applied to the hole injection electrode while the electron injection electrode was grounded to measure the current density. The results are shown in FIG. 3.

2. Luminance Properties

In respect to the devices that were fabricated in Examples 1 to 3 and Comparative examples 1 and 2, the luminance was measured by using PR650 colorimeter/radiometer manufactured by Photo-Research, Inc., and the luminance was obtained according to a change in current (10 mA/cm$^2$ to 100 mA/cm$^2$).

In respect to the devices that were fabricated in Examples 1 to 3 and Comparative example 1, the results of the driving voltage and the luminance that were obtained at a constant current (50 mA/cm$^2$) are described in the following Table 1. in the case when the thickness of the aluminum thin metal film was 7 nm or more like Comparative example 2, since the current was generated in a surface direction, it was impossible to measure the voltage and the luminance under the same condition.

The results are described in the following Table 1.

TABLE 1

| Section | Voltage (V) | Luminance (cd/m$^2$) |
|---|---|---|
| Example 1 | 4.78 | 11,200 |
| Example 2 | 4.82 | 9,930 |
| Example 3 | 4.90 | 7,200 |
| Comparative example 1 | 12.5 | 2,100 |

The invention claimed is:

1. An organic light emitting device comprising a cathode made of metal, at least one organic material layer including a light emitting layer and an anode in the sequentially layered form,
   wherein the organic light emitting device comprises a native metal oxide layer that is spontaneously formed on the cathode between the cathode and the organic material layer, a thin metal film is provided on the native metal oxide layer, and the thin metal film is made of metal selected from the group consisting of Al and Ag and has a thickness of greater than or equal to 1 nm and less than 7 nm,
   wherein the thin metal film is doped into the native metal oxide layer to change an interface junction characteristic between the native metal oxide layer and the at least one organic material layer provided on the native oxide layer, and
   wherein the thin metal film is formed on an entire surface of the substrate on which the cathode is formed.

2. The organic light emitting device as set forth in claim 1, wherein the cathode is made of a material selected from the group consisting of aluminum, molybdenum, chromium, magnesium, calcium, sodium, potassium, titanium, indium, yttrium, lithium, gadolinium, silver, tin, lead, and an alloy thereof.

3. The organic light emitting device as set forth in claim 1, wherein the thin metal film has a thickness in the range of 1 to 5 nm.

4. The organic light emitting device as set forth in claim 1, wherein a layer of the organic material layers that comes into contact with the thin metal film is an electron injection layer.

* * * * *